United States Patent
Sidorin et al.

(10) Patent No.: US 6,920,159 B2
(45) Date of Patent: Jul. 19, 2005

(54) TUNABLE OPTICAL SOURCE

(75) Inventors: Yakov Sidorin, Tucson, AZ (US); Ari H Kärkkäinen, Oulu (FI)

(73) Assignee: Optitune plc, London (GB)

( * ) Notice: Subject to any disclaimer, the term of this patent is extended or adjusted under 35 U.S.C. 154(b) by 47 days.

(21) Appl. No.: 10/306,742

(22) Filed: Nov. 29, 2002

(65) Prior Publication Data

US 2004/0105480 A1 Jun. 3, 2004

(51) Int. Cl.$^7$ .............................................. H01S 3/10
(52) U.S. Cl. ........................... 372/20; 372/92; 372/102
(58) Field of Search ............................ 372/20, 102, 92, 372/6; 385/10, 37, 143

(56) References Cited

U.S. PATENT DOCUMENTS

| | | | |
|---|---|---|---|
| 4,719,635 A | | 1/1988 | Yeh |
| 4,786,132 A | | 11/1988 | Gordon ....................... 385/38 |
| 4,850,682 A | | 7/1989 | Gerritsen |
| 5,042,898 A | | 8/1991 | Morey et al. .................. 385/37 |
| 5,448,398 A | | 9/1995 | Asakura et al. |
| 5,732,102 A | | 3/1998 | Bouadma |
| 5,870,417 A | | 2/1999 | Verdiell et al. ............... 372/32 |
| 6,144,795 A | * | 11/2000 | Dawes et al. ................ 385/141 |
| 6,215,928 B1 | | 4/2001 | Friesem et al. |
| 6,219,478 B1 | | 4/2001 | Parriaux et al. |
| 6,320,888 B1 | | 11/2001 | Tanaka et al. |
| 6,411,746 B1 | * | 6/2002 | Chamberlain et al. ......... 385/2 |
| 6,436,613 B1 | * | 8/2002 | Fallahi et al. ............... 430/321 |
| 6,480,513 B1 | * | 11/2002 | Kapany et al. ............... 372/20 |
| 6,488,414 B1 | * | 12/2002 | Dawes et al. .................. 385/79 |
| 6,632,585 B1 | * | 10/2003 | Nakamura ............... 430/281.1 |
| 6,683,895 B2 | | 1/2004 | Pilgrim et al. |
| 2001/0005387 A1 | | 6/2001 | Yamada et al. |
| 2001/0014429 A1 | | 8/2001 | Iha |
| 2001/0016093 A1 | * | 8/2001 | Dawes et al. .................. 385/14 |
| 2002/0169270 A1 | * | 11/2002 | Amberg-Schwab et al. .. 528/10 |
| 2003/0214700 A1 | | 11/2003 | Sidorin et al. |
| 2004/0037531 A1 | * | 2/2004 | Andrews et al. ............ 385/130 |
| 2004/0105480 A1 | | 6/2004 | Sidorin et al. |

FOREIGN PATENT DOCUMENTS

| | | |
|---|---|---|
| EP | 0 502 682 | 9/1992 |
| WO | WO 02/29944 | 4/2002 |

OTHER PUBLICATIONS

Terahertz Photonics Ltd., Brochure (developers of Hybrid Photonic Integrated Circuit (PIC), United Kingdom, 2 pgs.
Hiroshi, Patent Abstracts of Japan, vol. 012, No. 397 (E–672), Pub. No. 63137493; Oct. 21, 1988, Abstract Only.
Yuichi, M., Patent Abstracts of Japan, vol. 007, No. 154 (E–185), Pub. No. 58061692; Jul. 6, 1983, Abstract Only.
Nyairo et al., "Multichannel Grating Cavity (MGC) Laser Transmitter For Wavelength Division Multiplexing Applications," IEEE Proceedings J. Optoelectronics, Institution Of Electrical Engineers, Stevenage, GB, vol. 138, No. 5, Part J, Oct. 1, 1991, pp. 337–342, XP000267777, ISSN: 0267–3932.

* cited by examiner

*Primary Examiner*—Minsun Oh Harvey
*Assistant Examiner*—James Menefee
(74) *Attorney, Agent, or Firm*—Nixon & Vanderhye P.C.

(57) ABSTRACT

A tunable optical source comprises a laser diode and an external optical feedback device. The feedback device has a waveguiding portion fabricated at least in part out of a glass material having both organic and inorganic components. A control device is provided for controlling the refractive index of the glass material so as to change the wavelength of feedback to the laser diode. The glass material may for example have thermo-optic properties and the control device might then be a heating device for heating the glass material. The feedback device can have more than one portion, a second portion for example having controllable coupling characteristics for coupling optical radiation into or out of the feedback device. It also preferably has a portion for controlling optical path length in the feedback device.

24 Claims, 7 Drawing Sheets

FIGURE 6 (preform indices)

TUNABLE OPTICAL SOURCE

BACKGROUND

1. Technical Field

The present invention relates to tunable optical sources.

2. Description of Related Art

Semiconductor laser diodes are known as optical sources. Various techniques are used to obtain single mode, narrow linewidth operation which is desirable in applications such as communications. For instance, unmodified edge emitting laser diodes typically operate with several longitudinal modes lasing simultaneously, leading to low coherence and large linewidths. A technique known for use with edge emitting laser diodes is to use a grating to act as a wavelength filter in providing feedback to the lasing cavity to obtain single mode operation. Examples are the distributed feedback (DFB) and distributed Bragg reflector (DBR) lasers in which a grating extends at least partially along the length of the lasing cavity, or a neighbouring cavity in a monolithic arrangement, being formed for instance in the surface of a substrate supporting the lasing cavity and any neighbouring cavity.

An external cavity laser (ECL) is another known arrangement which uses wavelength selective feedback to obtain single mode operation. In this case, the lasing cavity is coupled via an end facet to a further cavity that contains a wavelength-selective feedback mechanism to provide feedback to the lasing cavity. The wavelength-selective feedback mechanism may for instance comprise individually mounted wavelength-selective optics in free space.

It is also known to use a DBR in an optical fibre as an external cavity providing tunable feedback to a laser diode. This is disclosed for example in U.S. Pat. No. 4,786,132. It is further known to use a distributed grating in a planar silica waveguide as an external cavity providing tunable feedback. This is disclosed for example in U.S. Pat. No. 5,870,417.

BRIEF SUMMARY OF EXEMPLARY NON-LIMITING EMBODIMENTS

According to an embodiment of the present invention, there is provided a tunable optical source comprising a tunable laser diode and an optical feedback device, the feedback device comprising a glass material having both organic and inorganic components and means for controlling the refractive index of the glass material so as to control the wavelength of feedback to the laser diode. The feedback device may comprises a planar waveguide structure provided with a wavelength selective filter whose optical performance is affected in use by the refractive index of said glass material so as to provide the control of the wavelength of feedback to the laser diode. The wavelength selective filter may comprise a diffraction grating.

The use of a glass material having both organic and inorganic components (referred to elsewhere in the present specification as "hybrid glass") offers considerable flexibility in material properties and a convenient way of providing a material with a controllable refractive index is to use a glass material which has thermo-optic properties. Control of the refractive index of the glass material might then be provided by a heater and/or a cooling device, such as one or more thin film heaters and/or a heat sink.

The use of such a glass material can have more than one advantage. Potential advantages include, for example:

Simplified processing and fabrication;
  lithographic patterning of the glass material, without etching
  material processing carried out at low temperatures
Relatively large wavelength tuning range
Compactness and packaging: there is a synergy between the use of the glass material and processing which allows the formation of the feedback device on substrates which can have embedded supporting control electronics and interconnects
Fabrication process compatibility with wafer level fabrication.

In a preferred embodiment, the feedback device comprises more than one portion, a first portion comprising said wavelength selective filter and said glass material and at least one second portion providing a different function in use of the feedback device. This allows added functionality, or improved performance characteristics, to be provided in one device. For example, the second portion might comprises an optical length modifier for modifying the optical length of the feedback device in use, or an optical coupling arrangement together with control means for modifying at least one optical coupling characteristic of the coupling arrangement in use.

In an example of an optical coupling arrangement, this might be provided in the form of a mode taper or focussing section. Alternatively, it could be provided as a branched waveguide for selective coupling of optical radiation out of the feedback device in use, wherein the control means controls the waveguiding characteristic of the branched waveguide so as to apportion optical radiation travelling in the feedback device between different available optical paths.

The refractive index of material in the second portion may be independently controllable with respect to the refractive index of the glass material in the first portion. This allows different functions to be controlled appropriately if necessary. Alternatively, materials of the first and second portions might respond differently to the same control parameters.

Preferably at least one material in said second portion comprises a glass material having both organic and inorganic components. This can offer simplified fabrication and design. These advantages are due to the good processing characteristics of such glass materials and their flexibility in designed behaviour.

The, or each, glass material may conveniently be thermo-optic, having a refractive index which changes with temperature. For example, at least one of the glass materials may have a rate of refractive index change with temperature (dn/dT) which is at least $-18*10^{-5}$ ($1/°$ C.), and for another dn/dT is at least $-25*10^{-5}$ ($1/°$ C.).

A useful example of a thermo-optic glass for use in embodiments of the present invention is one which comprises a trichlorosilane material. In order to determine its thermo-optic coefficient, such a glass might contain at least one bifunctional and/or monofunctional siloxane, and/or at least one non-crosslinkable organic component.

The optical performance of a wavelength selective filter in an optical source according to an embodiment of the present invention can be controlled to provide thermo-optic tuning of the wavelength $\lambda_E$ per degree Centigrade, in use, of at least $d\lambda_B/dT = -0.17$ nm/$°$ C., and in some embodiments $d\lambda_B/dT > -0.25$ nm/$°$ C.

A convenient form of the filter might comprise a distributed diffraction grating and this can be formed in or on a said glass material in the feedback device, or in or on a material spaced therefrom, as long as changes in temperature can be made which affect the optical performance of the grating in use.

In a practical embodiment of the invention, a packaged optical assembly can be provided which comprises a tunable optical source as described above, mounted together with at least one optical performance monitoring device on a shared substrate. Alternatively or additionally, the assembly can be presented as an array of tunable optical sources, mounted on a shared substrate. The assembly may be provided with temperature control means, wherein:

the tunable optical sources each have thermo-optically controllable optical performance characteristics the tunable optical sources are all subject to said temperature control means for controlling their optical performance characteristics and wherein at least two of said tunable optical sources have different respective optical performance characteristics in response to said temperature control means.

This last-mentioned arrangement can allow a common control means to be used to achieve different results between optical sources.

As well as apparatus as generally described above, embodiments of the present invention also cover a method of tuning an optical source, which source comprises a feedback portion incorporating a glass material having both organic and inorganic components, said method comprising the step of changing the temperature of said glass material so as to change at least one optical performance characteristic of the feedback portion. For example, the optical performance characteristic may comprise modal effective refractive index for optical radiation propagating in the feedback portion.

BRIEF DESCRIPTION OF THE DRAWINGS

A tunable optical source will now be described as an embodiment of the present invention, by way of example only, with reference to the following figures in which.

It should be noted that, apart from the graphs of FIGS. 5 and 6, the accompanying figures are not intended to be drawn to scale but are schematic representations only.

1 DESCRIPTION OF AN EXEMPLARY NON-LIMITING EMBODIMENT OF THE INVENTION

Figure 1:
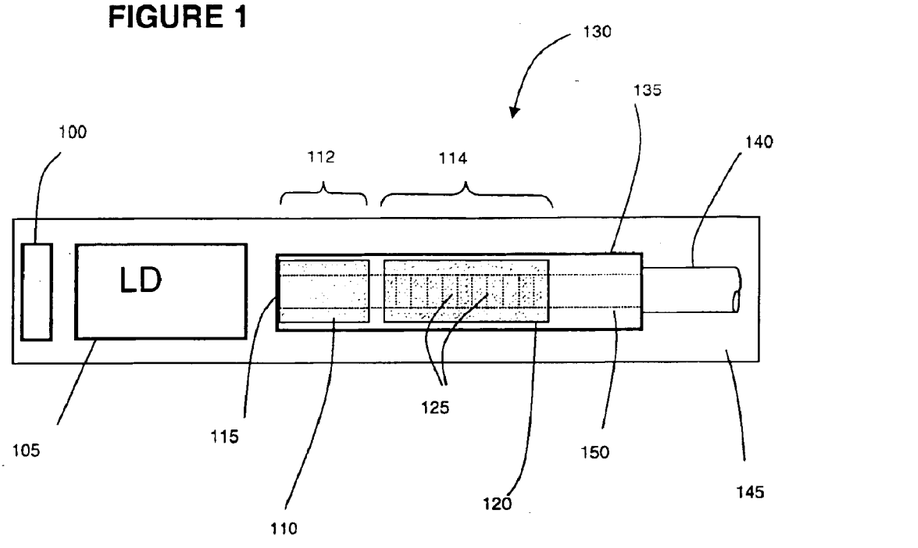
FIG. 1 shows a plan view of the tunable optical source.

Referring to FIG. 1, the tunable optical source comprises a Fabry-Perot type laser diode 105 coupled to an external waveguide-based device 135 providing feedback to the laser diode 105. The waveguide device 135 incorporates thermo-optic material carrying a distributed Bragg grating 125 and spectral characteristics of the feedback to the laser diode 105 are controlled by changing the temperature of the thermo-optic material, for instance by means of heating elements 110, 120. Overall, the waveguide device 135 is constructed as a planar waveguide arrangement and is packaged together with the laser diode 105 on a shared substrate 145 to provide a wafer-based sub-assembly 130. A further component of the sub-assembly 130 is a wavelength reference device 100 for monitoring the output wavelength of the laser diode 105.

The laser diode 105 may be of known type and may comprise for example a laser diode which is constructed as an edge emitting double heterostructure. Materials which might be used in the gain section for use in an embodiment of the invention need to meet the requirement that the output of the diode 105 can be tuned over a suitable range in use by means of wavelength selective feedback. Suitable materials can be selected from (but are not limited to) semiconductor materials from the III–V groups of the Periodic Table, such as GaInAsP/InP. Other examples of suitable materials can be selected from the group $Al_{1-x}Ga_xAs$, $In_{1-x}Ga_xAs_{1-y}P_y$, $Al_xGa_yIn_{1-x-y}P$ and $In_{1-x}Ga_xAs$.

The waveguide device 135 has at least two sections, these being a first waveguide section 112 with no grating and a second waveguide section 114 carrying the distributed Bragg grating 125. These sections 112, 114 can be made of different materials.

The first waveguide section 112 receives optical radiation from the laser diode 105 in use, via an input facet 115. The second waveguide section 114 carrying the distributed Bragg grating 125 sits beyond the first waveguide section 112 with respect to the laser diode 105. The two sections 112, 114 are provided with separate, independently controllable heating elements 110, 120.

The overall purpose of the waveguide device 135 is to provide controlled optical feedback to the laser diode 105 so as to tune the diode 105 spectrally. Laser tuning based on adjusting an external cavity typically involves one or both of the following aspects:

a) tuning a wavelength selective feedback element of the external cavity to vary the wavelength of optical feedback to the laser; and b) adjusting the optical path length of the external cavity in a phase continuous manner to avoid longitudinal mode hopping in use.

The first aspect, "a)", is achieved in embodiments of the present invention by controlling the refractive index of material in the second section 114 of the waveguide device 135 so as to adjust the wavelength selected for feedback by the grating 125. The second aspect, "b)", is achieved by controlling the refractive index of material in the first section 112 of the waveguide device 135 so as adjust the optical path length of the waveguide device 135 in use.

It might be noted that a further mechanism is available for tuning the laser diode 105 in that the injection current to the laser diode 105 can be controlled. However, tuning by changes in the injection current only provides a very limited tuning range. An option is to use wavelength tuning of the grating 125 in the second waveguide section 114 to provide a coarse tuning adjustment while injected current variation in the internal cavity of the laser diode 105 may provide fine tuning accessible to the user. Injected current variation is a known technique and is not therefore further described herein.

Optical coupling between the laser diode 105 and the waveguide device 135 can be accomplished in known ways, such as by butt-coupling an end facet of the laser diode 105 against an end facet 115 of the waveguide device 135, by using lens coupling or by using other methods known in the art. Examples of more specialised coupling arrangements are discussed below with reference to FIGS. 10 and 11.

The wavelength reference device 100 is an arrangement for monitoring the output wavelength of the laser diode 105 in order to counteract variations which might arise, for example, due to temperature fluctuations or ageing. Suitable devices are known and the device 100 is not further described herein. For example, a suitable device is described in U.S. patent application Ser. No. 10/186684 (assigned to Optitune plc) and further such devices are described in the international patent application published as WO 01/20251 and in U.S. Pat. No. 6,088,142. The output of such a device can be used for example in a feedback loop to control circuitry for changing the output wavelength of the laser diode 105. Such control circuitry might for example be arranged to change one or more of the following:

the feedback wavelength from the waveguide device 135 to the laser diode 105 the drive current to the laser diode 105 the temperature of the laser diode 105

Figure 2:
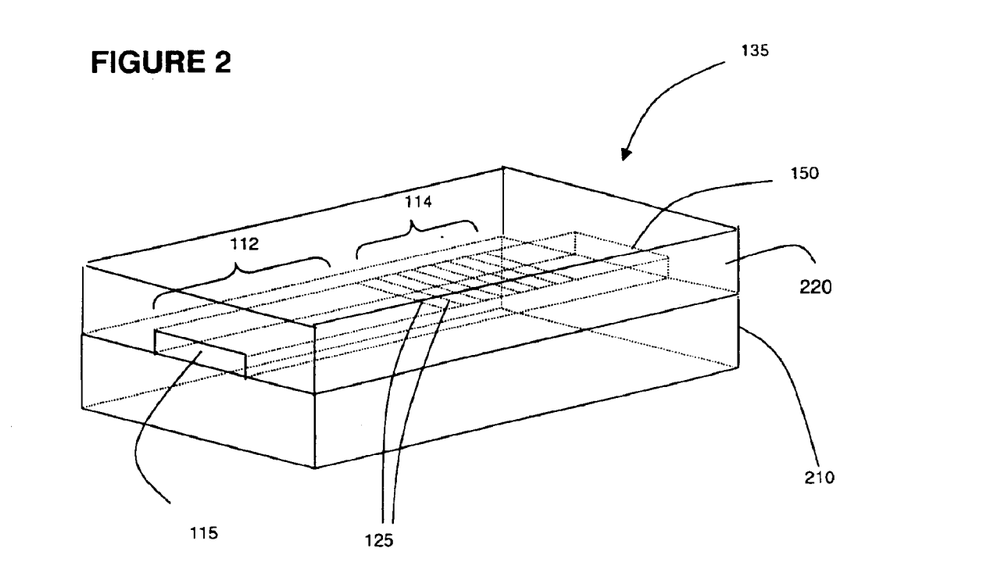
FIG. 2 shows a three quarter view from above of a waveguide-based device for use as a feedback device in the tunable optical source of FIG. 1.

Referring to FIG. 2, the waveguide device 135 in more detail comprises a planar ridge waveguide, having a ridge 150 of thermo-optic material mounted on a substrate 210. The substrate 210 may comprise a wafer but may have one or more protective, support and/or cladding layers on its upper surface and/or extending below the ridge 150 (not shown). The ridge 150 is buried by a cladding layer 220. In known manner, the refractive index of the material of the ridge 150 is higher than the refractive index of material around it, such as the cladding layer 220 and substrate 210, and this provides the core of the waveguide device 135.

The second waveguide section 114 of the waveguide device 135 carries the distributed Bragg grating on the upper surface of the ridge 150. In this embodiment, the grating is a rectilinear Bragg grating 125, comprising a set of grating elements which lie transverse to the optical axis in use of the ridge waveguide, constructed so as to produce variations in the effective refractive index "$n_{eff}$" of the waveguide mode which travels in the second waveguide section 114.

Optical radiation travelling in the waveguide device 135 in use generally has a beam spot, or beam cross section, which is at least roughly centred in the ridge 150 but extends into the material around it including the cladding layer 220. The nature of the beam cross section is determined in known manner by the refractive index profile of the cross section of the waveguide device 135 and this depends on a combination of factors, including particularly for example the difference in refractive index between the ridge 150 and the material(s) abutting it and the waveguide geometry.

(It should be noted here and throughout this specification that, unless the context indicates otherwise, terms such as "upper" and "lower", "below" and "above" should not be taken to imply any particular orientation in use. They are simply references to orientation as shown in the accompanying figures, used for ease of description and not for any other purpose.)

As mentioned above, there are two aspects to tuning the laser diode 105, adjusting the optical performance of the grating 125 and adjusting the optical path length of the waveguide device 135 in use. To adjust the optical performance of the grating 125, the temperature of at least part of the second section 114 of the waveguide device 135 is adjusted by means of the heating element 120. Because of the presence of thermo-optic material, this changes the modal effective refractive index in the second section 114 and thus the optical performance of the grating 125. To adjust the optical path length of the waveguide device 135, the temperature of the first section 112 of the waveguide device 135 is adjusted by means of its heating element 110. Because of the presence of thermo-optic material, this changes the modal effective refractive index in the first section 112 and thus the length of the external cavity for the laser diode 105.

2 HEATING ARRANGEMENTS

Figure 3A:
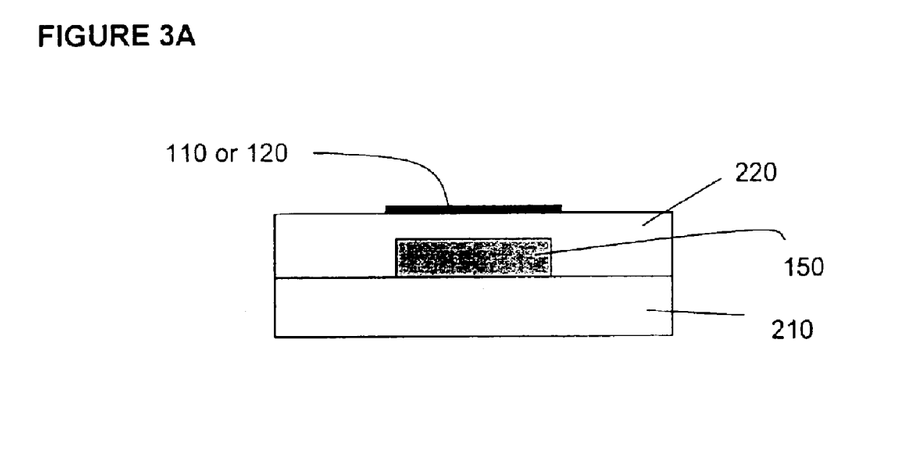
FIGS. 3a to 3c show vertical cross sections of a waveguide device as shown in FIG. 2, each in a direction transverse to the optical axis, with alternative heating arrangements.
Figure 3B:
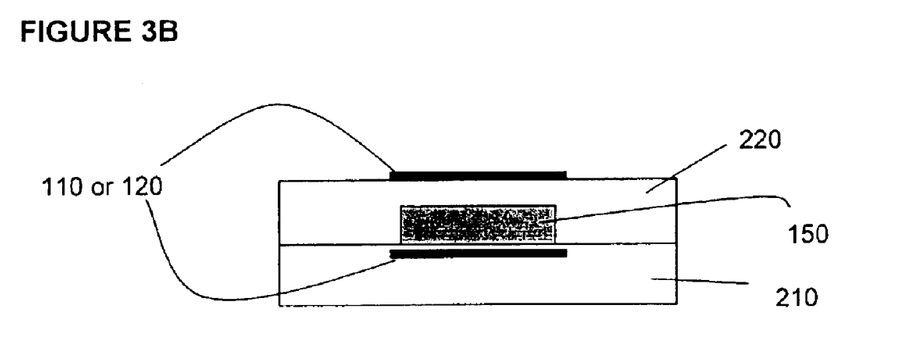
Figure 3C:
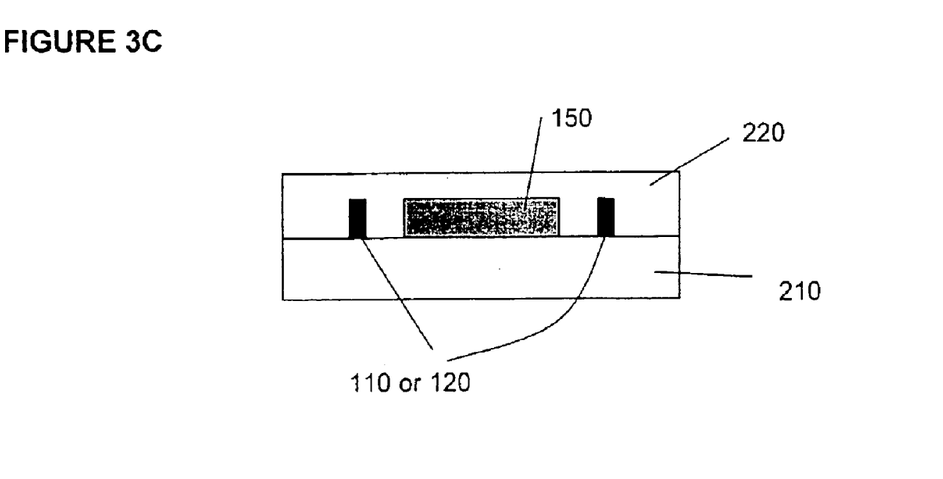

Referring to FIGS. 3*a* to 3*c*, the heating elements 110, 120 of the waveguide device 135 might be embodied as a thin film heater. The general construction and positioning of the heating elements 110, 120 in the first and second sections 112, 114 can be the same and the following description therefore applies to either or both heating elements 110, 120.

As mentioned above, the beam cross section of radiation travelling in the waveguide device 135 in use usually extends into the material around the ridge 150. It is therefore usually preferable that the heating elements 110, 120 do not abut the ridge 150 itself but are separated from it by a distance that puts them beyond the beam cross section. Otherwise, the presence of the heating elements 110, 120 can affect optical confinement in the waveguide device 135 and the heating element materials would have to be carefully selected in terms of optical quality and refractive index.

Referring to FIG. 3*a*, in a first version, the heating elements 110, 120 might either or both be provided as a thin film heater, applied to the upper surface of the cladding layer 220. Referring to FIG. 3*b*, in a second version, the heating elements 110, 120 comprise a pair of thin film heaters which extend parallel to the top and bottom planes of the ridge 150. Referring to FIG. 3*c*, the heating elements 110, 120 comprise a pair of thin film heaters which are embedded in the cladding layer 220 and extend parallel to the sides of the ridge 150 but spaced from it.

In order to reduce optical losses, heaters are preferably separated from the waveguiding region of the device 135 by a layer of dielectric material, which may itself be a part of the substrate 210 and/or cladding 220. Alternatively, there may be an additional dielectric buffer layer such as $SiO_2$.

The dimensions of the thin film heaters 110, 120 are typically such as to maximize the overlap between the produced heated volume and an optical mode travelling in the ridge 150 in use. Their thickness is not critical but may be about 1 $\mu$m. They may typically be several square millimetres up to some square centimetres when used above and/or below the device 135, as shown for instance in FIGS. 3*a* and 3*b*, or from some tens of microns wide and several millimetres long when used on either side of the waveguide device 135, as shown in FIG. 3*c*.

Figure 4:
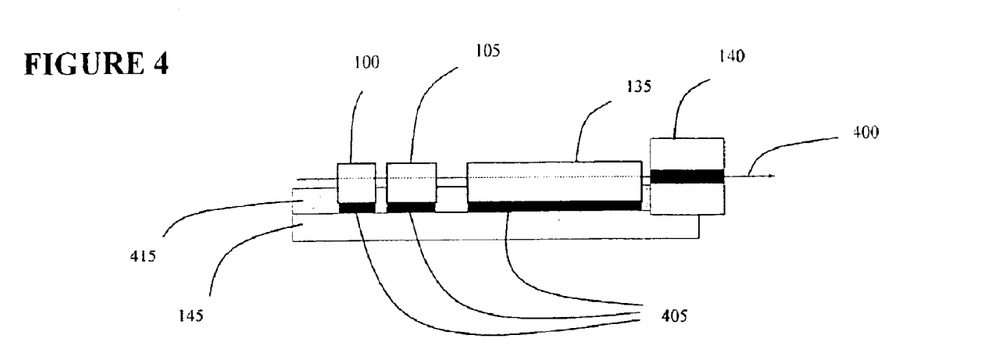
FIG. 4 shows a vertical cross section of the tunable optical source of FIG. 1, in the axial direction.

Referring to FIG. 4, the waveguide device 135 as a whole lends itself very well to packaging with other components on the shared substrate 145. Using an approach described in European patent application 02256515.4, filed on 19$^{th}$ Sep. 2002 in the name Optitune plc, the waveguide device 135 and other components may be mounted on integration pads 405 and partially embedded or surrounded by a packaging layer 415. As described in the referenced patent specification, the packaging layer 415 can be fabricated by lithography first, with mounting positions left open for the waveguide device 135 and other components. As well as mechanical protection, the packaging layer 415 can thus provide at least coarse optical alignment along an optical axis 400 for the waveguide device 135 and other components by means of the locations of the mounting positions. An optical fibre end can additionally be located, again by means of the packaging layer 415, along the same optical axis 400. This can be done using grey scale lithography to create a "V" groove in the packaging layer 415.

Hybrid glass materials lend themselves to use as packaging layers as described above since their components and fabrication can be selected to have good photolithographic and mechanical properties. The integration pads 1030 can be constructed from any suitable material which will adhere to the components and other materials it will be in contact with. The pads 1030 can also be used to provide electrical connections in the assembly and one or more may therefore be electrically conductive.

3 TUNING

3.1 Optical Performance of the Grating 125

The Bragg grating 125 in the second section 114 of the waveguide device 135 reflects a portion of optical radiation propagating down the waveguide back into the cavity of the laser diode 105 and thus determines the spectral region(s) within which the laser diode 105 generates light. The reflected optical radiation has a wavelength or range of wavelengths (the "feedback wavelength") which is determined in part by the dimensions of the grating 125 and in part by the refractive index of the waveguide materials. At least one relevant material of the waveguide device 135 is thermo-optic and the feedback wavelength can thus be tuned by using temperature to control refractive index "n" of the at least one relevant material.

Suitable forms of grating are known. In an example of a grating 125 which could be used in an embodiment of the present invention, the grating is a uniform rectilinear grating whose elements (lines) are normal to the local optical axis of the waveguide device 135 in use, although other orientations may be used. For instance, it is not essential that the grating elements are normal to the local optical axis.

Considering a uniform grating 125 which is normal to the local optical axis, the following phasematching requirement defines peak retro-reflection (Bragg) wavelength "$\lambda_B$" for providing optical feedback to the laser diode 105:

$$\lambda_B = 2N_{eff}\Lambda/m$$

where $\Lambda$ is the grating period, $N_{eff}$ is the local average effective refractive index of the propagating mode, and m is the order of diffraction.

The average of the effective index for the mode in the waveguide device is calculated over many grating periods to allow for the possibility of non-periodic, chirped, or other types of grating. Thus, for a waveguide mode with an effective refractive index of about 1.4847, and where m is 1, the grating periods to achieve two different Bragg wavelengths would be as follows:

Bragg wavelength 1550 nm: 522 nm

Bragg wavelength 1300 nm: 438 nm

It can be seen from the above equation that $\lambda_B$ is a function of modal refractive index and, using a thermo-optic material, of the temperature of the material of the waveguide device 135 delivering the optical radiation to the grating 125. It is important in an embodiment of the present invention that each material in the waveguide device 135 which is involved in transmitting the optical radiation in use should have isotropic optical qualities which are maintained when the temperature changes. Otherwise perturbation can be introduced by tuning and the feedback mechanism can deteriorate or fail.

Optical tuning is primarily achieved through the thermo-optic effect described above, as a result of change in the refractive indices of one or more of the materials the waveguide device 135 is made of and, therefore, change of the modal effective index, $N_{eff}$, in the waveguide device 135 in the grating region. The average change of effective index of refraction determines the change in the peak interaction wavelength (Bragg wavelength) according to $\delta\lambda/\lambda = \delta N_{eff}/N_{eff}$. However, some secondary mechanisms, such as thermal expansion and mechanical stress (if applied), may also affect the wavelength shift, although their influence is comparatively small. Indeed, a more general form of the change in the Bragg wavelength, $\Delta\lambda_B$, can be written as:

$$\Delta\lambda_B = \lambda_B(CTE+TOC) \cdot \Delta T + \lambda_B(1-p_e) \cdot \Delta \in \Delta T$$

where

CTE is the coefficient of thermal expansion of the material,

TOC is the thermo-optic coefficient of the material, $p_e$ is the photoelastic coefficient of the material, and $\Delta\in$ is the change is material strain with the change in temperature, $\Delta T$ As used in this specification, the TOC of a material is determined by $(dn/dT)*(1/n)$. dn/dT in practice will be constant over the tuning ranges of interest.

In the absence of applied material strain, thermal expansion will still contribute to the Bragg wavelength of the grating. However, within a typical range of CTE values for glass-like materials (about a few units of $10^{-6}$) the influence of thermal expansion on wavelength shift is far less than the thermo-optic effect and an example of this can be seen in FIG. 5.

Figure 5:
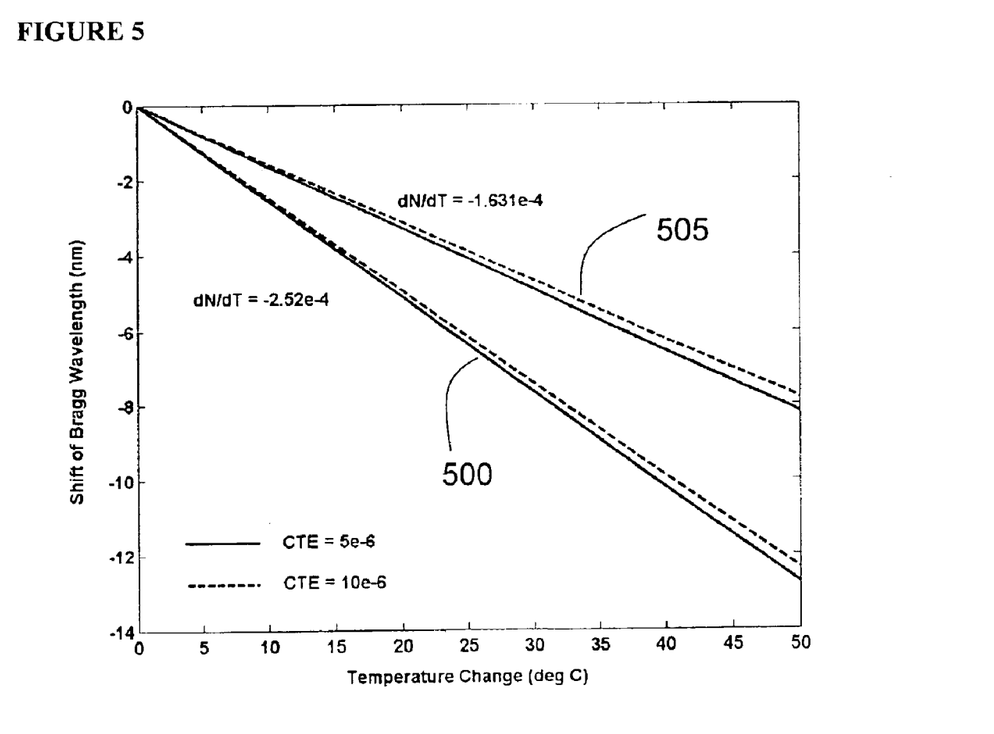
FIG. 5 shows a graph of Bragg wavelength shift for a distributed grating used to provide feedback in the tunable source of FIG. 1, for two different examples of waveguide device material.

FIG. 5 shows two pairs of curves relating a shift in Bragg wavelength to an applied change in temperature. The pairs of curves relate to first and second waveguide devices 135 whose ridges 150 are fabricated in hybrid glass materials having different $dN_{eff}/dT$ relationships. The materials and fabrication of the first and second waveguide devices are described below as "Waveguide Device Example 1" and "Waveguide Device Example 2". "Waveguide Device Example 1" relates to a first pair of curves 500 where $dN_{eff}/dT$ is about $-25.2*10^{-5}$ (1/° C.) and "Waveguide Device Example 2" relates to a second pair of curves 505 where $dN_{eff}/dT$ is about $-16.31*10^{-5}$ (1/° C.).

(The units 1/° C. will be understood as intended herein to mean reciprocal degrees Celsius.)

The first pair of curves 500 shows the change in the Bragg wavelength which can be achieved by changing the temperature of all of the material in a waveguide device structure 135 according to "Waveguide Device Example 1" over a temperature range of 50° C. The change in the Bragg wavelength is between 12 and 13 nm. The pair of curves 500 is shown respectively in full and dotted lines, these relating to ridge materials which have CTEs of $5*10^{-6}$(1/° C.) and $10*10^{-6}$(1/° C.) respectively. It can be seen that the difference introduced by this factor of 2 in the CTEs is approximately 0.4 nm.

The second pair of curves 505 shows the change in the Bragg wavelength which can be achieved by changing the temperature of the material of a structure according to "Waveguide Device Example 2" over a temperature range of 50° C. The change in the Bragg wavelength is between 8.5 and 9 nm. The pair of curves 505 is again shown respectively in full and dotted lines, these relating to materials which have CTEs of $5*10^{-6}$ and $10*10^{-6}$ respectively. It can be seen that the difference introduced by this factor of 2 in the CTEs is again approximately 0.4 nm.

It is interesting to compare the above figures for the change in the Bragg wavelength with those available if the ridge material of Waveguide Device Examples 1 and 2 is replaced by an inorganic silica-based glass. The temperature change which would be required to achieve a change in the Bragg wavelength of 13 nm would be 1000° C. Even for a silicon-based material, it would be about 200° C.

The change of refraction index with temperature, dn/dT, in a hybrid glass material can be modified by adjusting the chemical composition of the material and this is further discussed below.

Figure 6:
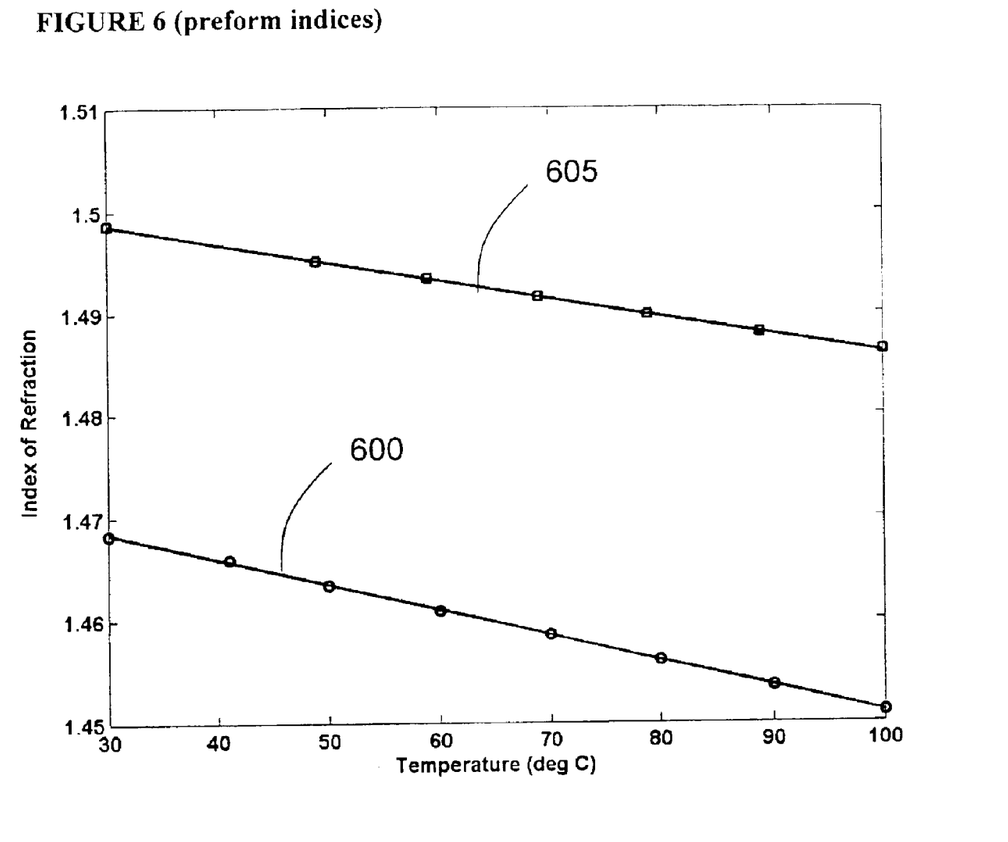
FIG. 6 shows a graph of the refractive index/temperature relationship for two different preform materials for a waveguide device as shown in FIG. 2.

FIG. 6 shows experimental data for the two hybrid glass materials with different thermo-optic coefficients described below as ridge materials for "Waveguide Device Example 1" and "Waveguide Device Example 2". In this case, the data is for the bulk materials rather than for a waveguide fabricated from the materials. The lower trace 600 is relevant to Example 1 and shows a change in refractive index of approximately $-25*10^{-5}$ (1/° C.). The upper trace 605 is relevant to Example 2 and shows a change in refractive index of approximately $-18*10^{-5}$ (1/° C.).

Temperature-related characteristics of the waveguide device 135 are discussed above. However, physical characteristics also affect performance. For example, although a distributed grating 125 of higher odd orders ($3^{rd}$, $5^{th}$, etc) could be used for optical feedback to the laser diode 105, it is preferable to use the first order feedback because higher orders tend to produce higher optical losses. The duty cycle of the grating 125 will affect grating strength and the arrangement of the heating elements 120 is also a factor which will affect performance in use. In general, when the spectrum of optical radiation travelling in the waveguide device 135 is within the bandwidth of the grating 125, the grating 125 will reflect the radiation as feedback to the laser diode 105. The bandwidth of the grating can be varied by using any of several known techniques such as grating phase shifting, chirping, or the use of multiple-section grating structures.

FIG. 5 is relevant to an arrangement in which only the material of the ridge 150 of the waveguide device 135 is thermo-optic. It is possible to enhance the tunability of the grating 125 by using a material for the cladding layer 220 which is also transparent in the spectral region of operation and thermo-optic. For example, the cladding layer 220 could be fabricated from a second thermo-optic hybrid glass material. Then the average effective index of the waveguide mode in the grating region will partly depend on the refractive index of the cladding layer 220.

In any embodiment, the refractive index of the cladding layer 220 may be chosen to be similar to the index of the substrate 220 in order to increase the symmetry of the output mode (for improved coupling to an output fibre 140 and ease of sub-assembly packaging).

3.2 Optical Path Length Control in the Waveguide Device 135

In order to avoid discontinuous behaviour in the waveguide device 135, it is important to match the change in optical path length in the external cavity to the change in wavelength produced in tuning. This can be done in the first waveguide section 112 by controlling the modal effective refractive index there to produce a compensatory change in optical path length of the waveguide device 135 at the same rate at which the peak wavelength of the wavelength selective filter in the external cavity (for example, a distributed Bragg grating) is changed. This general type of compensation is known and not further discussed herein.

4 MATERIALS AND FABRICATION

4.1 Hybrid Glasses

Hybrid glass materials used in embodiments of the present invention are variable combinations of organic and inorganic components which can be deposited on a substrate 220 to produce a waveguide preform. The material is applied to a suitable substrate using a known dynamic spinning procedure followed by pre-baking. The preform may comprise several layers, thus supporting a multilayered waveguide device realization.

Hybrid glass materials suitable for use in embodiments of the present invention comprise an amorphous or non-crystalline solid material having both organic and inorganic components. In more detail, an inorganic matrix can be provided at least in part by an appropriate inorganic network former such as any metal alkoxide or salt that can be hydrolysed, including those based on groups 3A, 3B, 4B and 5B of the Periodic Table, such as silicon dioxide, aluminium oxide, titanium dioxide and zirconium oxide. Functional organic components can then be used to modify the inorganic matrix.

These materials can be selected to have particular characteristics to suit a particular application. For instance, a hybrid glass material can be selected that can be processed using either high or low processing temperatures, and simple processing techniques. Hybrid glass materials are generally relatively stable and have mechanical properties which are more adjustable than either an organic material or an inorganic glass on its own. They can be selected to be easy to polish by having a high elastic modulus (>2 GPa), they can be thermally stable up to 500° C. and they can be used in standard integrated circuit processing and manufacturing lines to produce layers of accurate thickness.

These characteristics arise as follows

High or Low Temperature Processing:

By selection of appropriate components, it is possible to use high or low temperature processing of a hybrid glass material, for instance at 450° C. or less than 200° C. or even less than 150° C. In particular, if high processing temperatures are required the organic component content should generally be kept to a minimum. Low processing temperatures are made possible by using thermal- or photoinitiators resulting in polymerization of the organic matrix. The polymerisation may be achieved through organic carbon-carbon double bond openings and crosslinking. Known thermal initiators include benzophenone and various peroxides, such as benzoylperoxide and layroyl peroxide. Known photoinitiators include phenyl bis(2,4,6-trimethylbenzoyl)phosphine oxide (Irgacure 819) and 1-hydroxy-cyclohexyl-phenyl-ketone (Irgacure 814). (Irgacure initiators are products of Ciba Specialty Chemicals Inc. and "Irgacure" is a registered trade mark.)

Simple Processing Techniques:

For example, a hybrid glass material can be designed to support lithographic processing by including an organic component which polymerises by cross-linking. This might be for example one or more of the functional hydrocarbon compounds comprising acrylates, epoxides, alkyls, alkenes, or aromatic groups which support photopolymerisation. Gray scale lithography of hybrid glass materials is described for example in the following: "Fabrication of Micro-Optical Structures by Applying Negative-Tone Hybrid Glass Materials and Greyscale Lithography", by A. H. O. Kärkkäinen, J. T. Rantala, M. R. Descour, published in Electronics Letters, Vol. 38, No. 1, pp 23–24 (2002). Further, hybrid glass materials can be processed to produce a thick assembly structure (for instance in the range from 1 micron to 1 mm) by lithographic means.

Adjustable Mechanical Properties:

In general, the mechanical properties of a hybrid glass can be adjusted by changing the relative content of inorganic versus organic materials. For example, if the concentration of inorganic materials is increased:

the coefficient of thermal expansion (CTE) decreases the hardness increases the stress modulus increases stability typically increases.

If the concentration of organic materials is increased:

the material softens and becomes more elastic the CTE increases stability typically decreases.

As well as the above general mechanical characteristics, determined by the relative proportions of inorganic/organic materials, the behaviour of a hybrid glass can also be affected by the specific components selected. For example, some organic materials will withstand higher processing temperatures than others. The use of thermal- and/or photoinitiators can affect thermal stability and an inorganic matrix may capture and protect an organic matrix and thereby give higher stability.

As well as the reference given above, hybrid glasses are also disclosed in the following publication: "Siloxane-Based Hybrid Glass Materials for Binary and Grayscale Mask Photoimaging", by A. H. O. Kärkkäinen, J. T. Rantala, A. Maaninen, G. E. Jabbour and M. R. Descour, published in Advanced Materials, Vol. 14, No. 7, pp 535–540 (2002).

The relationship dn/dT in these hybrid glasses usually has a value of the order of $\sim -20*10^{-5}$ 1/° C. and can be adjusted based on the crosslinking density of organic-inorganic components in the material matrix. Increasing crosslinking density in an organo-siloxane matrix decreases the intrinsic dn/dT value of the material. The materials crosslinking density in an organic-inorganic matrix can be raised using two different approaches. A first approach is to increase the molar concentration of tetra functional siloxanes in the matrix, for example by increasing the compositional concentration of precursors that are capable of forming four silicon-oxygen bridges to other silicon atoms. A second approach is to increase the amount of multi-functional organic moieties in the matrix and especially components that are able to undergo organic crosslinking through organic double bond polymerization.

The intrinsic dn/dT value will be decreased in hybrid glasses by:

increasing the concentration of tetrafunctional siloxanes increasing the concentration of thermally or radiation crosslinkable organic moieties increasing the concentration of non-organic-moieties containing metal or metalloid components The intrinsic dn/dT value will be increased in hybrid glasses by:

increasing the concentration of bifunctional and monofunctional siloxanes increasing the concentration of non-crosslinkable organic moieties If the composition of the material changes then the refractive index of the material will usually change as well. However, this can be compensated by fluorination of the organic moieties. Consequently dn/dT can be adjusted to an appropriate level without losing the refractive index relationships required in the waveguide device 135 for appropriate waveguiding.

4.2 Other Materials of the Waveguide Device 135

Various materials that are used in integrated optics may be of use in embodiments of the present invention to provide supporting structure and parts such as additional waveguide-based optical circuitry, substrates and packaging. These might include for example glasses, semiconductor materials selected from group IV of the periodic table, compound semiconductor materials selected from one or more of the III–V, II–VI and IV–VI groups of the periodic table, various photorefractive and electro-optic materials and glasses, and various ceramics, such as low-temperature co-fired ceramics.

The substrate 210 and ridge 150 of the waveguide device 135 may alternatively be fabricated using the known "silica-on-silicon" material approach while the cladding comprises a thermo-optical hybrid glass material. Spectrally tunable optical feedback to the laser diode 105 is still achieved as long as the waveguide device 135 comprises a hybrid-glass material with thermo-optic properties which is positioned so as to change the effective modal refractive index for radiation being reflected by the grating 125.

Where known materials are used in an embodiment of the present invention, known methods of processing can be used, such as etching, embossing and thin-film technology.

Where the heating elements 110, 120 are concerned, conventional materials such as gold, aluminium, titanium, chromium or nickel or combinations thereof can be used, or optically transparent materials such as indium tin oxide, doped tin oxides, or, potentially, polymers such as polyanilene or polythiophene and their derivatives. They may be provided with low resistivity gold pads (not shown) for bonding to external conductors 300, or other suitable connections.

4.3 Fabrication Techniques

To make a waveguide device 135 according to an embodiment of the present invention, the following steps can be used.

A waveguide ridge 150 of a rectangular cross-section is fabricated on a suitable substrate 210, using a material with pre-selected thermo-optic coefficients and refractive index higher than the index of the substrate. A first-order distributed Bragg grating 125 is created on top of the ridge 150. The ridge 150 is then overcoated with a cladding layer 220 to provide optical confinement for the waveguide mode.

To fabricate the ridge 150, a traditional lithographic approach can be used. For example, the waveguide preform can be exposed to UV light through a dark-field contact mask, which may contain both binary and grey-scale features, and developed with a chemical developer. The material behaves as a negative-tone photoresist. The hybrid glass can then be baked at elevated temperatures. To create the grating 125, the ridge is exposed to a deep-UV (eg 193 nm) laser through a phase mask to generate changes in refractive index. Alternatively, a holographic exposure technique can be used.

Optionally, a metal thin film can be sputtered onto the cladding layer 220 of the waveguide device 135 and patterned by photolithography or the like to form thin film heaters 110, 120.

It is not essential that the grating 125 should be disposed on top of the ridge 150. For example, a substrate with a built-in distributed grating 125 on its upper surface might be used to carry the ridge waveguide and cladding arrangements.

Microstructured elements can be used as heaters or electrodes in embodiments of the invention. These can offer improved delivery of heat or voltage to materials. Known techniques for fabricating micro-structured heaters/electrodes include for example lithography and etching which allow the heaters/electrodes to be shaped, making them curved, wire-like, mushroom-like or other shape, rather than just a layer deposition. The shaping of the heaters/electrodes can be used to maximise overlap between the optical mode of the waveguide device 135 and the influence of the heaters/electrodes in controlling refractive index.

It is sometimes the case that an optical device or component has a non-planar surface. For example, the waveguide ridge 150 described above may result in a device which has a non-planar surface. Rough or non-planar surfaces can be complicated to post-process. Options for dealing with this are for example mechanical or chemical polishing and/or planarisation. Planarisation can be done by spinning an additional thick layer of a material such as a hybrid glass, or an adhesion material, onto the non-uniform surface.

4.4 Waveguide Device Example 1

The following describes the fabrication of a waveguide device 135 of the general type shown in FIG. 3a but including an additional buffer layer extending under the ridge. It supports the first pair of curves 500 in FIG. 5 and the first curve 600 in FIG. 6.

A silicon substrate is provided, covered with a thick buffer layer of silica with an index of about 1.45 at an operating wavelength of 1550 nm, and dn/dT value of about $+1*10^{-5}$ (1/° C.).

A hybrid glass material for the film preform for the ridge 150 is synthesized as follows. 0.1 mol of phenyltrichlorosilane, 0.062 mol of 3-methacryloxypropyltrichlorosilane are mixed and hydrolyzed in the presence of ultra pure (typically where contamination is less than 10 ppb) water. The mixture is reacted for a time (from 1 hour to 48 hours) sufficient to allow all the silanes to hydrolyze. The organic solvent phase is separated from the solution. The material is finalized by removing volatile components such as water and solvent from the solution and 0.5 wt-% of benzophenone and 0.25 wt-% of Irgacure 819 and Irgacure 184 are added.

In These Hybrid-glass Materials:

Phenyltrichlorosilane is used to increase the CTE as compared to silicon dioxide values. The phenyl moiety is highly stable and also provides physical flexibility and elasticity in the resulting material. It hydrolyses and condenses to form a silicon oxide matrix.

3-methacryloxypropyltrichlorosilane is used to make material photosensitive. A methacryloxy moiety forms photosensitivity through acryloxy carbon to carbon double bond breakage and continual crosslinking polymerisation. The organic polymer matrix formed increases the CTE and is not as stable as an inorganic silicon oxide matrix. The trichloro-part undergoes hydrolysis and condensation and forms a silicon oxide matrix.

Benzophenone is used as a thermal/photo initiator to form free radicals during thermal/optical exposure to create methacryloxy crosslinking.

Irgacure is used as a photoinitiator to form free radicals during photo exposure to activate methacryloxy crosslinking. Irgacure initiators are products of Ciba Specialty Chemicals.

Other optional precursors that may be used are for example: vinyltrichlorosilane, propyltrichlorosilane, trimethylchlorosilane, trivinylchlorosilane, methyltrichlorosilane, dimethyldichlorosilane, 1,1,1-trifluoropropyltrichlorosilane and 1H, 1H, 2H 2H-perfluorooctyltrichlorosilane.

To create the film preform, the hybrid glass material is spun-on by applying a dynamic spinning procedure and edge bead removal is carried out by using acetone spray. The sample is prebaked at 150° C. for 5 minutes on a hot-plate in a nitrogen atmosphere. The index of the film preform is about 1.47 at 20° C., and its dn/dT value is about $-25*10^{-5}$ (1/° C.).

The ridge 150 of the waveguide device 135 is then produced using traditional lithography by exposing it to UV light (through a dark-field contact mask which may contain both binary and grey-scale features), developing with a chemical developer (isopropanol/methyl isopropyl ketone) and post-baking at 200° C. The cross-sectional dimensions of the waveguide device ridge 150 are about 6-by-6 microns.

A first order 50% duty cycle distributed grating 125 with the period of about 526 nm is formed on the top surface of the waveguide ridge with the help of holographic UV exposure. In the next step a thick cladding 220 made of the buffer material is spun-on and baked. The lowest order transverse mode in such a section 114 of the waveguide device 135 has an effective index of about $N_{eff}=1.4603$ at an operating wavelength of 1550 nm at 20° C. Finally, a nickel thin film is sputtered onto the cladding layer 220 of the waveguide device 135 to form upper heating elements 110, 120 which are about 15 microns wide. In a thus obtained waveguide device 135 the tuning of the Bragg wavelength will occur at a rate of about −0.27 nm/° C. By adjusting the temperature by 50 C. the overall Bragg wavelength decrease of $\Delta\lambda_B \sim 13$ nm can be obtained.

In order to translate this into values for the power that will need to be delivered to the heating elements 110, 120, one must consider the effects of heat transfer in the finished device. Using a widely-accepted value for thermal conductivity of glass-like materials of about 0.8 [$Wm^{-1}K^{-1}$] and the thickness of the thermal barrier (comparable to the waveguide device thickness) of about 20 microns, the heat power to be provided by the heating elements 110, 120 for such a rate of tuning is estimated to be about 0.6 mW per millimetre of the heating element's length.

4.5 Waveguide Device Example 2

The following describes the fabrication of a waveguide device 135 supporting the second pair of curves 505 in FIG. 5 and the second curve 605 in FIG. 6. This generally has the structure shown in FIG. 3b with heaters 110, 120 both above and below the ridge 150.

A thick silica based glass-on-silicon substrate is provided with a built in thin-film indium tin oxide heater which is about 10 microns wide. The index of refraction of the substrate glass is about 1.47 at 1550 nm at 20° C., and its dn/dT value is about $+1*10^{-5}$ (1/° C.).

The waveguide device preform is synthesized in a fashion analogous to that presented in Example 1, but with a different component content: 0.1 mol of phenyltrichlorosilane, 0.077 mol of 3-methacryloxypropyltrichlorosilane are mixed and hydrolyzed in the presence of ultra pure water. The mixture is reacted for a time (from 1 hour to 48 hours) sufficient to allow all the silanes to hydrolyze. The organic solvent phase is separated from the solution. The material is finalized by removing volatile components such as water and solvent from the solution and 0.5 wt-% of benzophenone and 0.25 wt-% of Irgacure 819 and Irgacure 184 are added.

The refractive index of this preform is about 1.5 with dn/dT of about $-18*10^{-5}$ (1/° C.).

Fabrication steps and parameters associated with waveguide device formation in this embodiment are similar to those described in Example 1. On the top surface of the waveguide ridge a $1^{st}$ order 50% duty cycle surface-relief rectilinear 0.5 micron deep distributed grating is formed using photolithography and reactive-ion etching. The grating is filled and overcoated with cladding made of the same material as that of the substrate, thus providing a symmetric optical confinement for the propagating mode, and the second heater is deposited on top.

In the thus fabricated single waveguide device 135 the average mode index is about 1.4883 at 20° C., and its rate of change is about $dN_{eff}/dT=-16.31*10^{-5}$ (1/° C.), which leads to the Bragg wavelength's tuning in device 135 of about $d\lambda_B/dT=-0.17$ nm/° C. By adjusting the temperature by 50 C the overall Bragg wavelength decrease of $\Delta\lambda_B \sim 9$ nm can be obtained.

The heat power to be provided by thin-film heaters to achieve such a tuning range is similar to that provided in waveguide device example 1 described above.

5 ALTERNATIVE CONFIGURATIONS

Various alternative constructions could be used and at least some alternative waveguide device constructions are discussed below.

An important advantage of embodiments of the present invention is that one section of the waveguide device 135 can be fabricated using at least one material having a first thermo-optic coefficient and another section can be fabricated using at least one material having a second, different thermo-optic coefficient. This means that the refractive index behaviour of the two sections will be different under changes of temperature. The temperature of the two sections may also or alternatively be controlled independently, giving further flexibility. This supports for example flexibility in modal refractive index matching for coupling into or between sections of a waveguide device 135 which otherwise have different purposes, such as path length control and/or selective feedback. This is further discussed below.

A particularly convenient form of material which can be used in these different sections of the waveguide device 135 is hybrid glass which is relatively easy to use in fabrication and processing and whose properties can be adjusted by altering the components to achieve for example the required differences in thermo-optic coefficient.

Fabrication of a waveguide device having different sections can be carried out as a series of similar steps, each step resulting in a formation of a section of the waveguide device 135.

It is not essential that the external cavity waveguide device 135 is straight. It may contain straight or curved waveguide-based elements. Further, these elements may have any of several different functions, as well as wavelength selective feedback. For instance, the waveguide device 135 might incorporate arrayed-waveguide gratings, waveguide tapers, couplers, switches, waveguide interferometers and other waveguide based components, any or all might be made with the use of hybrid-glass material.

Figure 7:
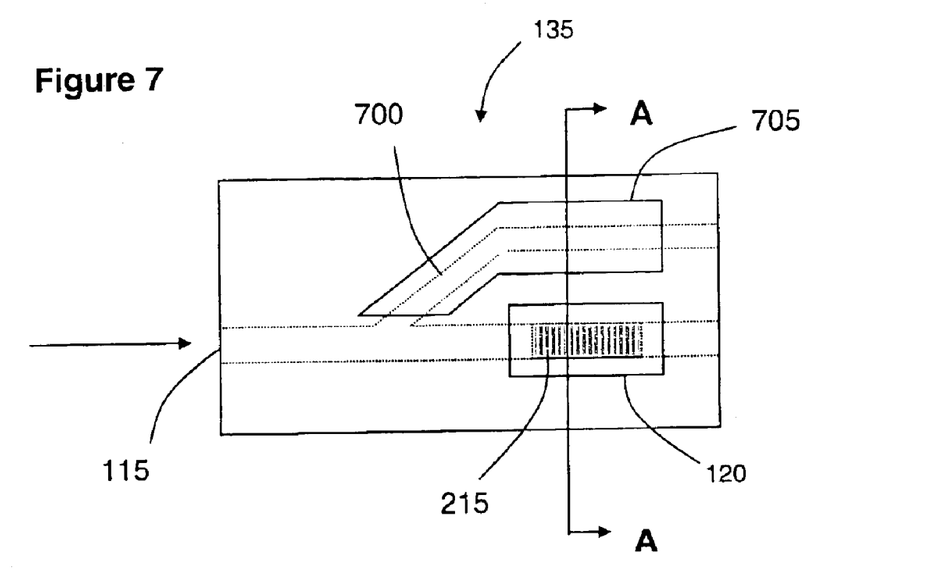
FIG. 7 shows a plan view of a coupler arrangement based on a waveguide device as shown in FIG. 2.
Figure 8:
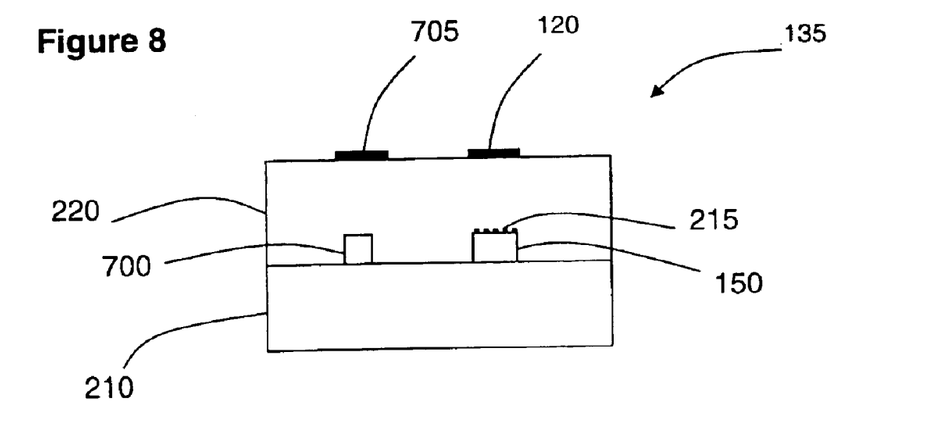
FIG. 8 shows a vertical cross section of the coupler arrangement of FIG. 7.

Referring to FIGS. 7 and 8, a waveguide device 135 for a tunable optical source according to an embodiment of the present invention incorporates a switchable waveguide coupler. This is provided by adding a waveguide branch 700 which can be used to divert radiation from the primary tuning waveguide with the grating 215. The waveguide branch 700 of the waveguide device 135 is also provided with a thermo-optic hybrid glass material in its ridge, and it has an independent heating element 705 which controls the effective refractive index of the mode in the waveguide branch 700 during operation of the tunable laser source.

When necessary, the effective refractive index of the mode in the waveguide branch 700 is brought close to that in the primary tuning waveguide-device with the grating 215, thus providing out-coupling of a portion of light into the waveguide branch 700.

Figure 9:
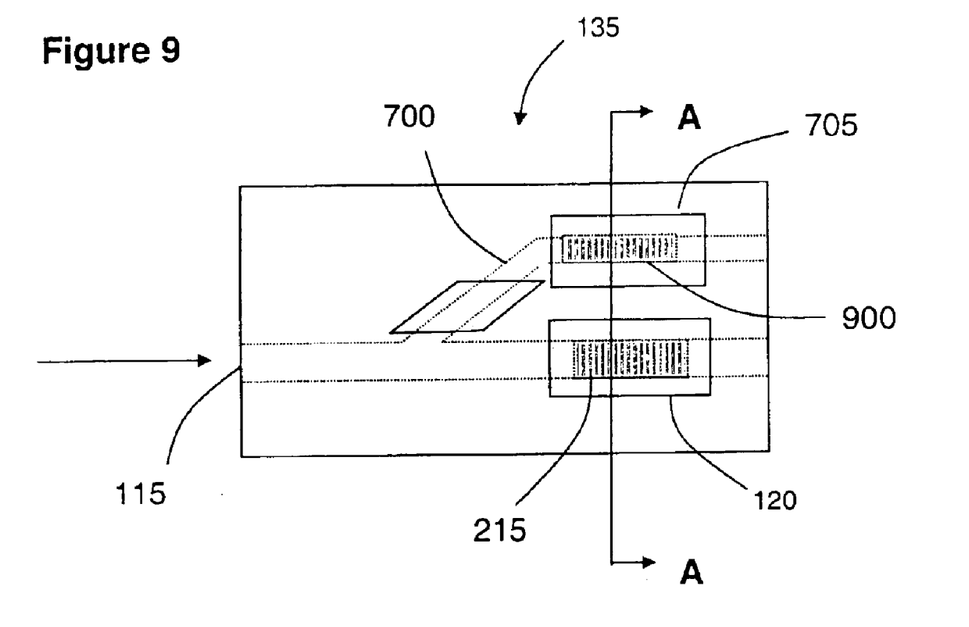
FIG. 9 shows a plan view of an optical switch arrangement based on a waveguide device of the type shown in FIG. 2.

Referring to FIG. 9, in a variation, the switchable waveguide coupler also provides a switchable out-coupling grating 900 so that at least one diffraction order from the optical radiation travelling in the waveguide branch 700 can be coupled out of the plane of the otherwise planar arrangement. In this case, an optically transparent heater (made of, for instance, indium tin oxide) can be provided over the grating 900. Such functions performed by the gratings per se (without the heater) are known and therefore not further described herein.

Figure 10:
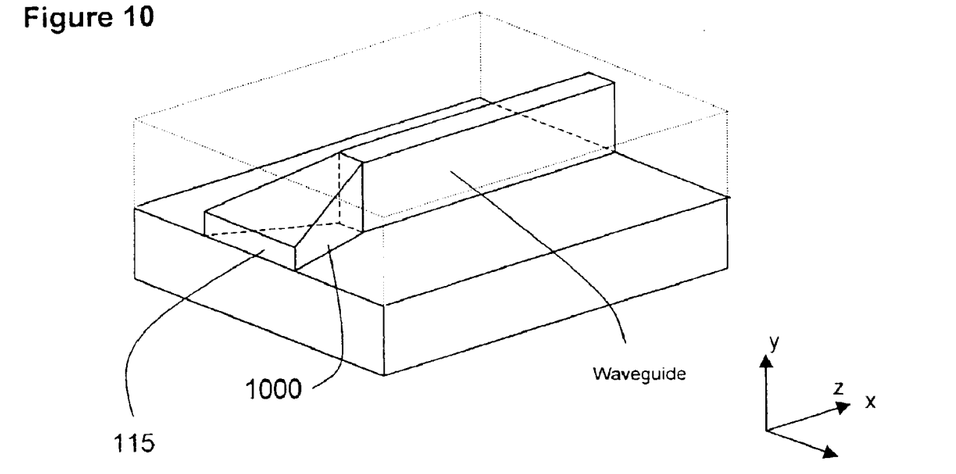
FIGS. 10 and 11 show three quarter views from above of alternative coupling arrangements for coupling optical radiation into a waveguide device of the type shown in FIG. 2.
Figure 11:
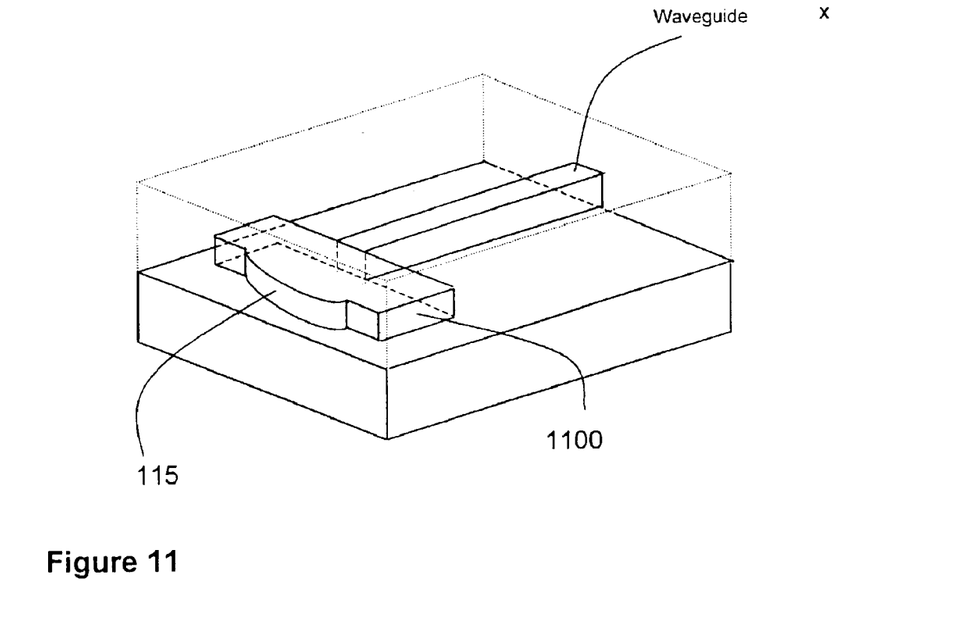

Referring to FIGS. 10 and 11, it is possible to use specialised coupling arrangements to deliver optical radiation to and from the waveguide device 135. This might be to and from the laser diode 105 (not shown) at the input facet 115 of the waveguide device 135, or it might to output optical arrangements for onward transmission at the other end of the waveguide device 135. FIGS. 10 and 11 show just the coupling arrangements.

Firstly, referring to FIG. 10, it is possible to use a mode taper section 1000. This serves the purpose of changing the dimensions of the mode cross-section in adiabatic fashion upon its propagation down the mode taper section 1000. Use of tapers for mode-size matching is known in the art, and has been used in both laser sources and passive waveguide devices.

The taper can be arranged as either "geometric", where the cross-section of the taper section varies along z-axis, or "index", where the material refractive index distribution of the taper section is z-dependent. For example, to fabricate the geometric taper from the hybrid-glass material used in the current invention, the use of a lithographic mask with both binary and gray-scale features is required. Tapering of the waveguide in xz-plane is achieved by providing the mask opening with variable width, while variable optical density in that mask opening will allow for different level of exposures along the z-axis, thus resulting in the height of the waveguide which is z-dependent. Thus fabricated taper-waveguide section will allow for better mode-size matching between, for instance, the modes of the LD source 105 and the waveguide device 135, which improves the butt-coupling efficiency.

Advantageously, it is possible to use a third independent heat control device (not shown) that controls the refractive index of the mode taper section 1000. This allows for fine adjustments of the mode-size so as to compensate for fabrication tolerances.

Secondly, referring to FIG. 11, it is also possible to use a focussing section 1100. Such a focussing section 1100 may be used with or without a mode taper section 1000 discussed above with reference to FIG. 10.

There are significant advantages in using a focussing section 1100 made with thermo-optic hybrid-glass material (s). For example, it allows for the possibility of compensating for fabrication and packaging errors by providing adjustment of focal length via a heating element (not shown). It can also significantly simplify coupling between a laser diode 105 and a waveguide device 135. Indeed, instead of required a butt-coupling distance of the order of 1 micron (between the components to be coupled) when using a waveguide device 135 with a normal-input-facet 115, the working coupling distance can be increased up to several tens of microns when using a focussing section 1100, depending on the refractive indices of the materials involved and the curvatures used.

Figure 12:
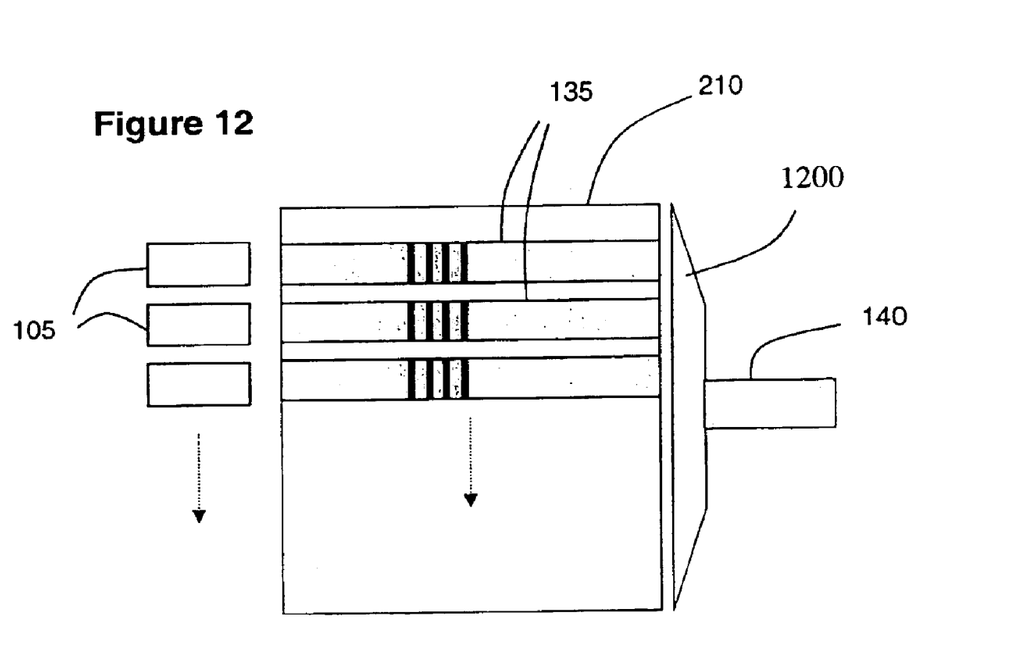
FIG. 12 shows a plan view of a wavelength multiplexer comprising an array of waveguide devices such as that shown in FIG. 2.

Referring to FIG. 12, a set of tunable optical sources 105, 135 according to embodiments of the present invention can be organised in an array of m tunable laser devices 105 aligned with m feedback devices 135. For example, m may be between 4 and 10. For ease of packaging and/or handling, the laser devices 105 are preferably separately tunable but mounted on a common substrate (not shown). The feedback devices 135 might be as any of the embodiments described above. Conveniently, the feedback devices 135 can be monolithically formed in a single fabrication cycle on a substrate 210.

The feedback devices 135 and the laser devices 105 can be mounted on a shared substrate 145 (not shown in FIG. 12) and "V" grooves can be provided lithographically in the shared substrate 145 to receive output optical fibre ends aligned with the waveguide devices 135 and secured using metallic bonding or other known technique. Alternatively, the outputs of the waveguide devices 135 can be fed into a multiplexer 1200 and combined for transmission along a single optical fibre 140.

Tunable arrays of this type will have various applications depending on the particular configuration of the external cavity feedback waveguide devices 135 and corresponding laser sources 105. For example, it would be possible to use similar devices and sum their outputs in order to get increased power for transmission in the fibre 140. Alternatively, the waveguide devices 135 might be provided with separately controllable heaters or electrodes. In such an embodiment, the physical proximity of the waveguide devices 135 may have to be taken into account. For example, it might be preferable that the waveguide devices 135 are not regularly arrayed, as shown, but offset from their neighbouring devices so that any section of a waveguide device 135 which needs to be at a different temperature from a section of its neighbouring waveguide device 135 in use is distanced from it. Further in this respect, it might be preferable to use heat sinks or cooling devices (not shown) to control the distribution of temperature in use.

In another example, the materials of the feedback devices 135 might be selected to show different responses to changes in temperature so that although temperature changes are applied across the array, the optical characteristics of at least two of the optical sources are different.

What is claimed is:

1. A tunable optical source comprising a laser diode and an external optical feedback device, the feedback device comprising a glass material having both organic and inorganic components and a controller for controlling the refractive index of the glass material so as to control the wavelength of feedback to the laser diode;
    wherein the feedback device comprises a planar waveguide structure provided with a wavelength selective filter whose optical performance is affected in use by the refractive index of said glass material so as to provide the control of the wavelength of feedback to the laser diode.

2. A tunable optical source according to claim 1 wherein the feedback device comprises more than one portion, a first portion comprising said wavelength selective filter and said glass material and a second portion providing a different function in use of the feedback device.

3. A tunable optical source according to claim 2 wherein the refractive index of material in the second portion is independently controllable with respect to the refractive index of the glass material in the first portion.

4. A tunable optical source according to either one of claims 2 or 3 wherein said material in said second portion comprises a glass material having both organic and inorganic components.

5. A tunable optical source according to claim 4 wherein the relationship dn/dT for the glass material of said second portion is different from the relationship dn/dT for the glass material of the first portion.

6. A tunable optical source according to claim 2 wherein said second portion comprises a semiconductor or dielectric material.

7. A tunable optical source according to claim 2 wherein said second portion comprises an optical length modifier for modifying the optical length of the feedback device in use.

8. A tunable optical source according to claim 2 wherein said second portion comprises an optical coupling arrangement and a controller for modifying at least one optical coupling characteristic of the coupling arrangement in use.

9. A tunable optical source according to claim 8 wherein the optical coupling arrangement provides focussing or mode taper in use.

10. A tunable optical source according to claim 8 wherein the optical coupling arrangement is arranged at an input to the feedback device for receiving optical radiation from the laser diode in use.

11. A tunable optical source according to claim 9 wherein the optical coupling arrangement comprises a branched waveguide for selectively coupling optical radiation out of the feedback device in use, and wherein the controller of the second portion controls the waveguiding characteristic of the branched waveguide so as to apportion optical radiation travelling in the feedback device between different available optical paths.

12. A tunable optical source according to claim 2 having two second portions, the two second portions comprising an optical length modifier and an optical coupling arrangements respectively.

13. A tunable optical source according to claim 1 wherein the glass material is thermo-optic, having a refractive index which changes with temperature.

14. A tunable optical source according to claim 13 wherein the glass material has a rate of refractive index change with temperature which is at least $-18*10^{-5}$ (1/° C.).

15. A tunable optical source according to claim 13 wherein the glass materials has a rate of refractive index change with temperature which is at least $-25*10^{-5}$ (1/° C.).

16. A tunable optical source according to claim 1 wherein said glass materials comprises a trichlorosilane material.

17. A tunable optical source according to claim 16 wherein the glass material comprises at least one bifunctional and/or monofunctional siloxane, and/or at least one non-crosslinkable organic component.

18. A tunable optical source according to claim 16 wherein the glass material comprises at least one bifunctional and/or monofunctional siloxane, and/or at least one crosslinkable organic component.

19. A tunable optical source according to claim 1 wherein the optical performance of the filter can be controlled to provide thermo-optic tuning of the wavelength $\lambda_E$ per degree Centigrade of at least $d\lambda_B/dT = -0.17$ nm/° C.

20. A tunable optical source according to claim 1 wherein the wavelength selective filter comprises a distributed diffraction grating.

21. A tunable optical source according to claim 20 wherein the distributed diffraction grating is formed in or on said glass material.

22. A packaged optical assembly comprising a tunable optical source according to claim 1 mounted together with at least one optical performance monitoring device on a shared substrate.

23. A packaged optical assembly comprising an array of tunable optical sources according to claim 1, mounted on a shared substrate.

24. A packaged optical assembly according to claim 23, provided with a temperature controller, wherein:

the tunable optical sources each have thermo-optically controllable optical performance characteristics;

the tunable optical sources are all subject to said temperature controller for controlling their optical performance characteristics;

and wherein at least two of said tunable optical sources have different respective optical performance characteristics in response to said temperature controller.

* * * * *